(12) United States Patent
Deschenes et al.

(10) Patent No.: US 9,435,834 B2
(45) Date of Patent: Sep. 6, 2016

(54) VOLTAGE MONITORING CIRCUIT

(71) Applicant: Cree, Inc., Durham, NC (US)

(72) Inventors: Pierre Deschenes, Muskego, WI (US); Bin Du, Mt. Pleasant, WI (US)

(73) Assignee: Cree, Inc., Durham, NC (US)

( * ) Notice: Subject to any disclaimer, the term of this patent is extended or adjusted under 35 U.S.C. 154(b) by 266 days.

(21) Appl. No.: 14/196,495

(22) Filed: Mar. 4, 2014

(65) Prior Publication Data

US 2015/0253361 A1 Sep. 10, 2015

(51) Int. Cl.
*G01R 19/22* (2006.01)
*G01R 1/30* (2006.01)

(52) U.S. Cl.
CPC ................... *G01R 19/22* (2013.01)

(58) Field of Classification Search
CPC .................. G01R 19/22; G01R 1/30
See application file for complete search history.

(56) References Cited

U.S. PATENT DOCUMENTS

2004/0061452 A1* 4/2004 Konopka ........... H05B 41/3925
315/209 R
2007/0182347 A1* 8/2007 Shteynberg ........ H05B 33/0815
315/312

* cited by examiner

*Primary Examiner* — Jermele M Hollington
(74) *Attorney, Agent, or Firm* — Myers Bigel & Sibley, P.A.

(57) ABSTRACT

A voltage monitoring circuit includes a line monitoring circuit configured to receive an AC line voltage and generate an output voltage in response to the AC line voltage exceeding a threshold voltage, and a rectifier circuit coupled to the line monitor circuit and configured to receive the output voltage from the line monitoring circuit generate a rectified voltage signal in response to the output voltage.

19 Claims, 4 Drawing Sheets

VOLTAGE MONITORING CIRCUIT

BACKGROUND

1. Field of the Invention

Some embodiments described herein relate to voltage monitoring circuits. In particular, some embodiments relate to voltage monitoring circuits for use in monitoring line voltages.

2. Description of Related Art

An electronic device, such as a solid state light emitting apparatus, may have a power limited AC/DC converter that will not consume power when it is in a low voltage condition. Accordingly, it is desirable to monitor whether or not the line voltage supplied to the device is within a desired operating range as determined by the design of the components. If the line voltage should fall outside the specified voltage range, inoperability or damage to the electronic device may occur.

SUMMARY

A voltage monitoring circuit according to some embodiments includes a line monitoring circuit configured to receive an AC line voltage signal and generate an output voltage signal in response to an amplitude of the AC line voltage exceeding a threshold voltage, and a rectifier circuit coupled to the line monitor circuit and configured to receive the output voltage signal from the line monitoring circuit and generate a rectified voltage signal in response to the output voltage The circuit may include an indicator circuit coupled to the rectifier circuit and configured to receive the rectified voltage signal. The indicator circuit is configured to generate an indicator signal in response to the rectified voltage signal. The indicator circuit may be configured to generate the indicator signal in response to an absence of the rectified voltage signal.

The line monitoring circuit may include a DIAC coupled to the AC line voltage signal.

The line monitoring circuit may further include a first resistor coupled between the DIAC and a neutral line, a second resistor coupled to the DIAC, and a transfer capacitor coupled to the second resistor.

The rectifier circuit may include a full wave bridge rectifier having an input coupled to the transfer capacitor and an output coupled to an output capacitor and a Zener diode.

The indicator circuit may include a solid state relay including an input diode coupled to the Zener diode, a light emitting diode, and an output relay coupled the light emitting diode.

The indicator circuit may further include a second DIAC coupled to the line voltage and to the light emitting diode.

The voltage monitoring circuit may further include a capacitor coupled in parallel with the second DIAC and the light emitting diode.

The voltage monitoring circuit may further include a neutral monitoring circuit coupled to the indicator circuit and to a neutral line and a ground line and configured to monitor a voltage level of the neutral line relative to the ground line.

The neutral monitoring circuit may include a diode having an anode coupled to the neutral line, a resistor coupled to the cathode of the diode, and a capacitor coupled to the resistor and the ground line. The indicator circuit may include a relay having an input diode coupled to the capacitor and an output switch coupled to a light emitting diode.

The indicator circuit may include (a) a first solid state relay including a first input diode coupled to the Zener diode, a light emitting diode, a first output relay coupled the light emitting diode, and (b) a second solid state relay including a second input diode coupled to the Zener diode and to a ground line, and a second output relay coupled to the first input diode and to the light emitting diode.

The voltage monitoring circuit may further include a lower limit monitoring circuit coupled to the AC line voltage signal and to the indicator circuit. The lower limit monitoring circuit may be configured to cause the indicator circuit to generate an indicator signal when an amplitude of the AC line voltage signal exceeds a voltage threshold.

The circuit may further include an upper limit monitoring circuit coupled to the AC line voltage signal and to the indicator circuit. The upper limit monitoring circuit may be configured to cause the indicator circuit to turn off the indicator signal when the amplitude of the AC line voltage signal exceeds a second voltage threshold.

The lower limit monitoring circuit includes a DIAC coupled to the AC line voltage signal.

The upper limit monitoring circuit includes a DIAC coupled to the AC line voltage signal.

A voltage monitoring circuit according to further embodiments includes a line monitoring circuit including a DIAC coupled to an AC voltage supply line and configured generate an output voltage signal in response to an AC line voltage signal on the AC voltage supply line exceeding a threshold voltage, a rectifier circuit coupled to the line monitor circuit and configured to receive the output voltage signal from the line monitoring circuit and generate a rectified voltage signal in response to the output voltage, and an indicator circuit including a solid stat relay coupled to the rectifier circuit and configured to receive the rectified voltage signal. The indicator circuit may be configured to generate an indicator signal in response to the rectified voltage signal being applied to an input of the solid state relay.

The voltage monitoring circuit may further include a neutral monitoring circuit coupled the indicator circuit. The neutral monitoring circuit and the indicator circuit may be configured to generate an indicator signal in response to a voltage on a neutral line being greater than a ground voltage.

The voltage monitoring circuit may further include a lower limit monitoring circuit and an upper limit monitoring circuit coupled to the AC line voltage signal and to the indicator circuit. The lower limit monitoring circuit may be configured to cause the indicator circuit to generate an indicator signal when the amplitude of the AC line voltage signal exceeds a first voltage threshold, and the upper limit monitoring circuit may be configured to cause the indicator circuit to turn off the indicator signal when the amplitude of the AC line voltage signal exceeds a second voltage threshold.

A voltage monitoring circuit according to further embodiments includes a line monitoring circuit configured to receive an AC line voltage signal and generate an output voltage signal in response to the AC line voltage exceeding a threshold voltage, a rectifier circuit coupled to the line monitor circuit and configured to receive the output voltage signal from the line monitoring circuit and generate a rectified voltage signal in response to the output voltage signal, and an indicator circuit coupled to the rectifier circuit and configured to receive the rectified voltage signal. The indicator circuit is configured to generate an indicator signal in response to the rectified voltage signal. The circuit further includes a lower limit monitoring circuit and an upper limit monitoring circuit coupled to the AC line voltage signal and to the indicator circuit. The lower limit monitoring circuit may be configured to cause the indicator circuit to generate an indicator signal when the amplitude of the AC line voltage signal exceeds a first voltage threshold, and the upper limit monitoring circuit may be configured to cause the indicator circuit to turn off the indicator signal when the amplitude of the AC line voltage signal exceeds a second voltage threshold.

BRIEF DESCRIPTION OF THE DRAWINGS

The accompanying drawings are included to provide a further understanding of the disclosure and are incorporated in and constitute a part of this application. In the drawings.

DETAILED DESCRIPTION OF EMBODIMENTS

Figure 1:
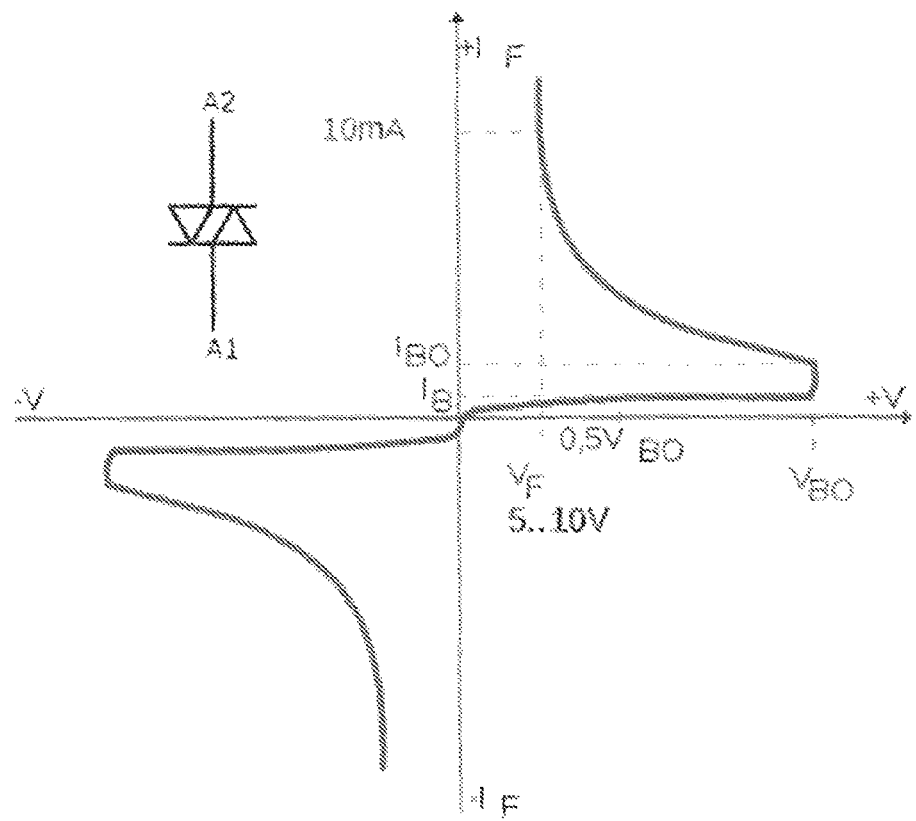
FIG. 1 is a graph of a current-voltage relationship for a DIAC device.

Embodiments of the present inventive concepts now will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Some embodiments provide a voltage monitoring circuit that monitors one or more voltages in an electrical circuit and detects if any of the voltages is outside a specified range. In particular, some embodiments monitor a voltage to determine if the voltage is too low. Ordinarily, the monitored voltage should have a level that is somewhere between the line voltage and the neutral voltage of the power source that is powering the electronic device. Some embodiments also monitor if the ground voltage is at a lower potential than neutral. Furthermore, some embodiments provide voltage monitoring circuits that incorporate DIAC technology, which is normally used for surge protection and not voltage monitoring.

Some embodiments monitor an AC line voltage to detect when the line voltage is out of specification. For example, a nominal 120V AC line may be out of specification when the voltage on the line falls below 100V. A voltage monitoring circuit according to some embodiments can turn on an indicator light, such as an LED, in response to detecting a low or out of range voltage. The indicator light may be continuous or blinking depending on how the voltage monitoring circuit is configured. In some embodiments, if the line voltage exceeds a predetermined voltage, the LED will turn off.

Some embodiments address a problem that can arise in solid state lighting systems in which when a low line voltage could degrade the performance of the system, such as by causing a low lumen output or excessive ground current. An excessive ground current could be the result of a neutral connection becoming high impedance.

As will be appreciated, a DIAC or "diode for alternating current," is a diode that conducts bidirectional current only after its breakover voltage, $V_{BO}$, has been reached. A current-voltage relationship for a typical DIAC is shown in FIG. 1. As shown therein, when the voltage on the DIAC exceeds the breakover voltage $V_{BO}$, the diode enters a region of negative dynamic resistance in which current increases while the forward voltage on the device drops, until a stable forward voltage $V_F$ is reached. This leads to a decrease in the voltage drop across the diode and, usually, a sharp increase in current through the diode. The diode remains "in conduction" until the current through the diode drops below a value that is characteristic of the device, called the holding current, $I_H$. When the current through the diode drops below the holding current, the diode switches back to a high-resistance (non-conducting) state. This behavior is bidirectional, i.e., it occurs for both directions of current, as illustrated in FIG. 1.

Figure 2:
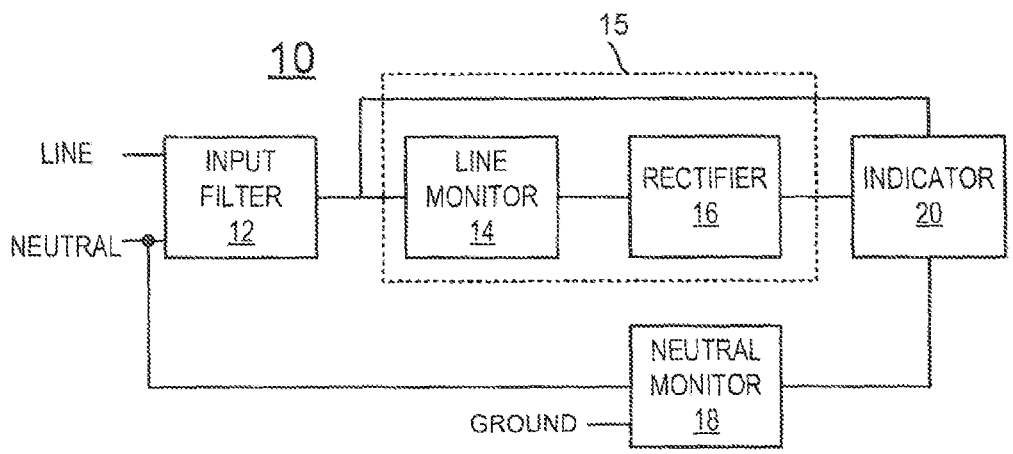
FIG. 2 is a block diagram of a voltage monitoring circuit according to some embodiments.

FIG. 2 is a block diagram of a voltage monitoring circuit 10 according to some embodiments. As shown therein, a voltage monitoring circuit 10 includes an input filter 12 that receives a LINE input and a NEUTRAL input. The output of the filter 12 is provided to a circuit 15 including a line voltage monitor 14 that monitors the filtered LINE voltage and a rectifier circuit 16, and also to an indicator circuit 20. The line voltage monitor 14 outputs a monitoring voltage signal to the rectifier circuit 16. The rectifier circuit 16 rectifies the monitoring voltage signal to produce a DC monitoring signal that is provided to the indicator circuit 20. A neutral monitoring circuit 18 receives the NEUTRAL and GROUND input signals and monitors the level of the NEUTRAL input relative to GROUND. The neutral monitoring circuit 18 is also coupled to the indicator circuit 20.

In operation, if the amplitude of the LINE voltage falls below a threshold value, or if the voltage level of the GROUND line falls below the voltage level of the NEUTRAL line, the indicator circuit 20 displays a notification signal, such as by illuminating an LED. Operation of the voltage monitoring circuit 10 is described in more detail below.

Figure 3:
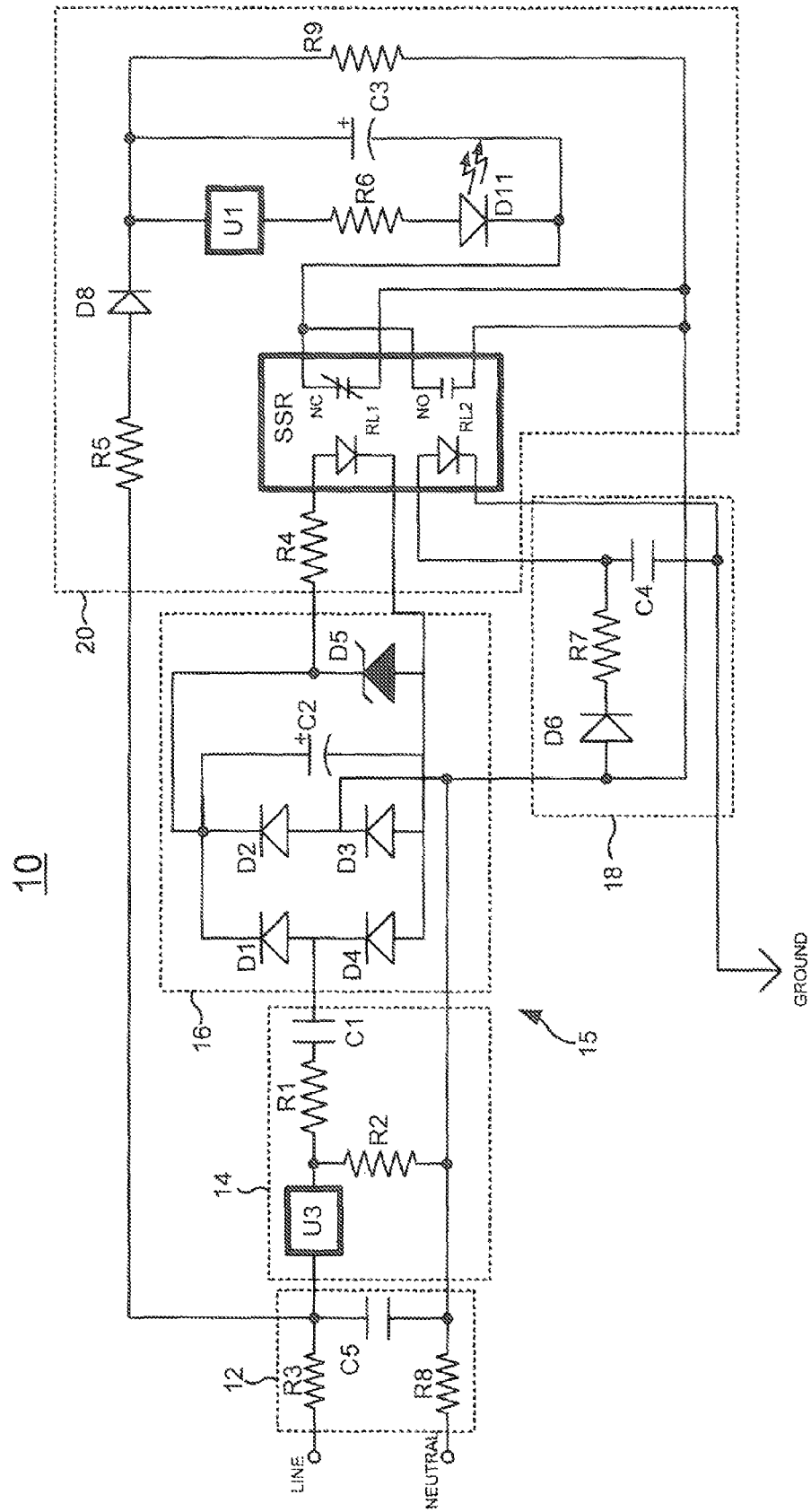
FIG. 3 is a circuit diagram of a voltage monitoring circuit according to some embodiments.

An embodiment of a voltage monitoring circuit 10 is illustrated in more detail in FIG. 3. As shown therein, the voltage monitoring circuit 10 includes an input filter circuit 12, a line monitor circuit 14, a rectifier circuit 16, a neutral monitoring circuit 18 and an indicator circuit 20.

The input filter circuit 12 includes resistors R3 and R8 and a capacitor C5. For monitoring a 60 Hz 120V line voltage, the resistors R3 and R8 may have resistances of 500 ohms each, and the capacitor C5 may have a capacitance of 0.22 microfarads. However, these circuit element values can be adjusted as desired for monitoring a different voltage level. The input filter 12 is provided to attenuate electrical noise that could otherwise cause the monitoring circuit 10 to malfunction. The input filter 12 receives the LINE and NEUTRAL voltage connections and filters the electrical LINE voltage. A GROUND connection to the voltage monitor circuit 10 is also provided.

The line monitor circuit 14 includes a DIAC U3, resistors R1 and R2 and a capacitor C1. The resistors R1 and R2 may have resistances of 120 ohms and 12 kohms, respectively, and the capacitor C1 may have a capacitance of 0.22 microfarads. In some embodiments, resistor R2 may be an adjustable power resistor. The DIAC U3 may be a K1500E70 bidirectional thyristor have a breakover voltage of about 140-170 volts and a holding current of about 60-150 milliamps. However, these circuit element values can be adjusted as desired for monitoring a different voltage level.

The rectifier circuit 16 includes diodes D1-D5 and capacitor C2. The diodes D1-D4 are connected to form a full-wave rectifier circuit. The diode D5 is a Zener diode having a Zener voltage of about 10 V. The capacitor C2 may have a capacitance of about 470 microfarads. However, these circuit element values can be adjusted as desired for monitoring a different voltage level. An output of the full-wave rectifier circuit is supplied to the cathode of the Zener diode D5, which is connected in parallel with the capacitor C2.

The neutral monitoring circuit 18 includes a diode D6, a resistor R7 and a capacitor C4. The resistor R7 may have a resistance of 250 ohms, and the capacitor C4 may have a capacitance of 1 microfarad. However, these circuit element values can be adjusted as desired for monitoring a different voltage level.

The indicator circuit 20 includes resistors R4, R5, R6 and R9, a DIAC U1, a capacitor C3, a diode D8, a light emitting diode D11 and a solid state relay block SSR including two relays RL1 and RL2. The first relay RL1 of the solid state relay block SSR includes a first diode that controls a normally closed (NC) relay switch, while the second relay RL2 of the solid state relay SSR includes a second diode that controls a normally open (NO) relay switch. Thus, when the diode of the first relay RL1 is energized, the normally closed relay switch is opened. Conversely, when the diode of the second relay RL2 is energized, the normally open relay switch is closed.

The resistors R4, R5, R6 and R9 may have resistances of 250 ohms, 47 kohms, 150 ohms, and 220 kohms, respectively. The capacitor C3 may have a capacitance of 47 microfarads. However, these circuit element values can be adjusted as desired for monitoring a different voltage level.

Both the normally open relay switch and the normally closed relay switch have terminals coupled to the cathode of the light emitting diode D11 and to the NEUTRAL line.

Thus, if either of the relay switches closes, the cathode of the light emitting diode D11 will be connected to the NEUTRAL line.

The neutral monitoring circuit 18 is coupled to the diode in the second relay RL2. When the neutral monitoring circuit 18 detects that the NEUTRAL line voltage is higher than the GROUND voltage, the neutral monitoring circuit 18 energizes the second relay RL2, causing the cathode of the light emitting diode D11 to be connected to the NEUTRAL line. As will be described in more detail below, this results in the LED D11 being energized to emit light.

The output of the filter circuit 12 is coupled to an input of the DIAC U1 through the resistor R5 and the diode D8. The output of the DIAC U1 is coupled to the anode of the LED D11 through the resistor R6. The capacitor C3 is coupled in parallel to the DIAC/R6/D11 circuit branch. The resistor R9 is coupled between the input of the DIAC and the NEUTRAL line.

The rectifier circuit 16 is coupled to the diode in the first relay RL1 of the solid state relay SSR. In particular, the cathode of the Zener diode D5 is coupled to the anode of the diode in the first relay RL1 through the resistor R4, while the anode of the Zener diode D5 is coupled to the cathode of the diode in the first relay RL1.

The line voltage monitoring circuit 14 will only allow a voltage to pass through if the voltage is above a voltage threshold that is based on the breakover voltage of the DIAC U3 and the resistance of resistor R2.

The AC/DC rectifier circuit 16 is a full-wave rectifier that rectifies and stabilizes the voltage passed by the voltage monitoring stage 14, for example, to a voltage of about 10V based on a Zener voltage of the diode D5.

When the amplitude the LINE voltage applied to the AC/DC rectifier stage 16 reaches a voltage threshold (V1), current flow through the resistor R4 will bias the diode of the relay RL1 in the solid state relay SSR. This in turn opens the relay RL1, which stops current from flowing through the LED D11, and keeps the LED D11 from being energized.

When the amplitude of the voltage input to the AC/DC. rectifier stage 16 falls below the threshold value V1, the AC/DC rectifier stage 16 is de-energized, which stops the current flow through the resistor R4 and closes the contact of the relay RL2. At this point the cathode of the LED D11 is connected to NEUTRAL. The LINE voltage will be above the breakover voltage of the DIAC U1, causing the LED D11 to turn on. When the amplitude of the LINE voltage falls low enough that the current through the DIAC U1 drops below the holding current, the LED D11 will turn off for a period of time determined by the time constant of the RC circuit formed by the resistor R5 and the capacitor C3. When the capacitor C3 has charged sufficiently, the diode D11 will turn on again. This on-off cycle will continue until the LINE voltage is raised above the breakover voltage of the DIAC U1.

Figure 4:
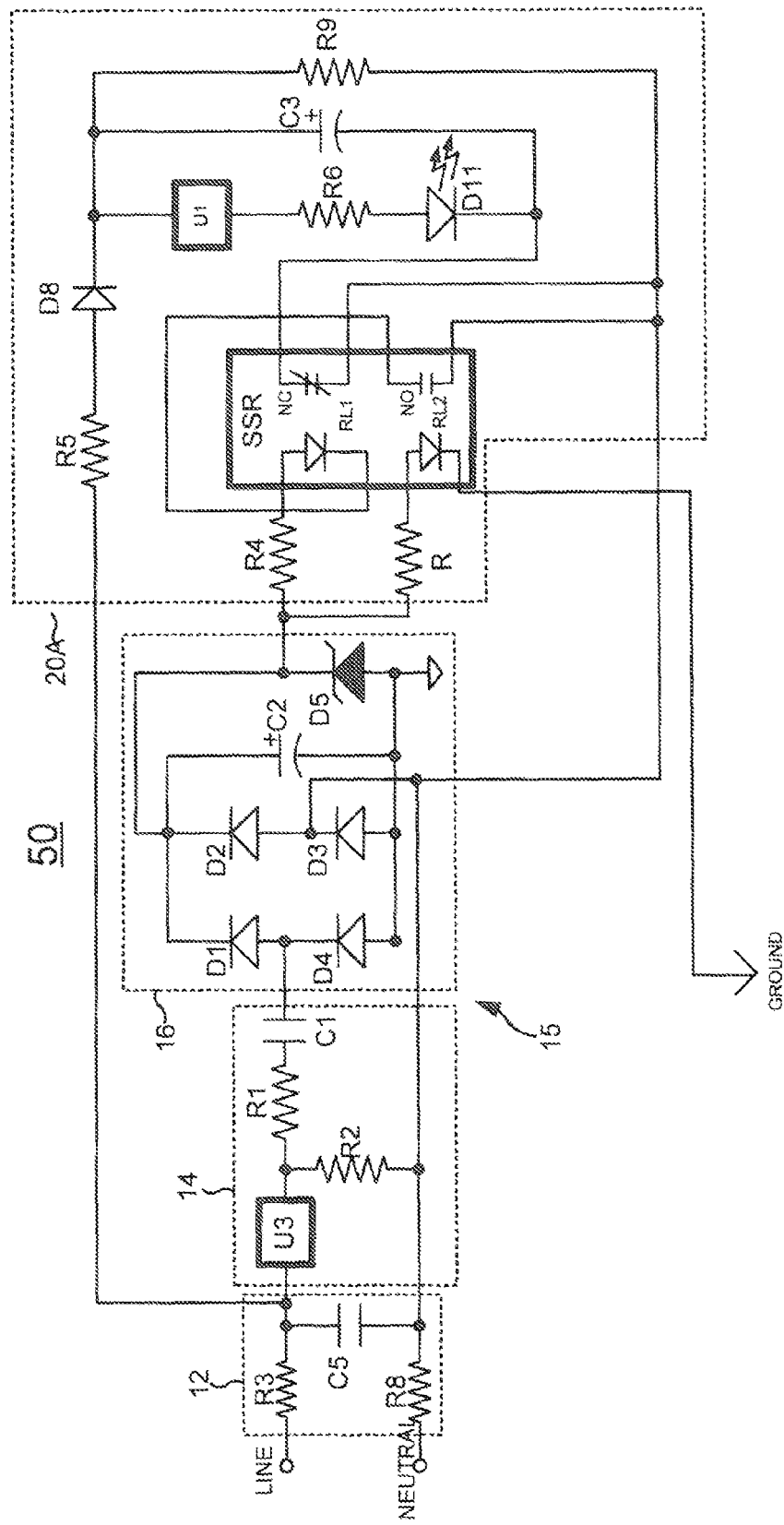
FIG. 4 is a circuit diagram of a voltage monitoring circuit according to further embodiments.

FIG. 4 is a circuit diagram of a voltage monitoring circuit 50 according to further embodiments. The voltage monitoring circuit 50 monitors an AC line voltage, and also provides an indication if the GROUND connection becomes disconnected. The voltage monitoring circuit 50 of FIG. 4 is similar to the voltage monitoring circuit 10 of FIG. 3, except that the voltage monitoring circuit 50 does not include a neutral line monitoring circuit. Rather, the cathode of the diode D5 in the rectifier circuit 16 is coupled to the anode of the diode in the second relay RL2 of the solid state relay SSR in the indicator circuit 20A through a resistor R, while the cathode of the diode in the second relay RL2 is coupled to GROUND. The resistor R may have a resistance of 250 ohms. However, this circuit element value can be adjusted as desired for monitoring a different voltage level.

In addition, the cathode of the diode in the first relay RL1 is coupled to the normally open switch in the second relay RL2.

The voltage monitoring circuit 50 of FIG. 4 operates according to a similar principle as the voltage monitoring circuit 10 of FIG. 3, with the added feature that when the connection to GROUND is lost, the diode of the second relay RL2 of the solid state relay SSR is de-energized. This causes the normally open relay switch of the second relay RL2 to open, which removes power from the diode of the first relay RL1. This in turn causes the normally closed relay switch of the first relay RL1 to close, connecting the anode of the LED to NEUTRAL and causing the LED D11 to enter the on-off cycle described above. Thus, an indication of a GROUND fault can be provided by the indicator circuit 20.

Figure 5:
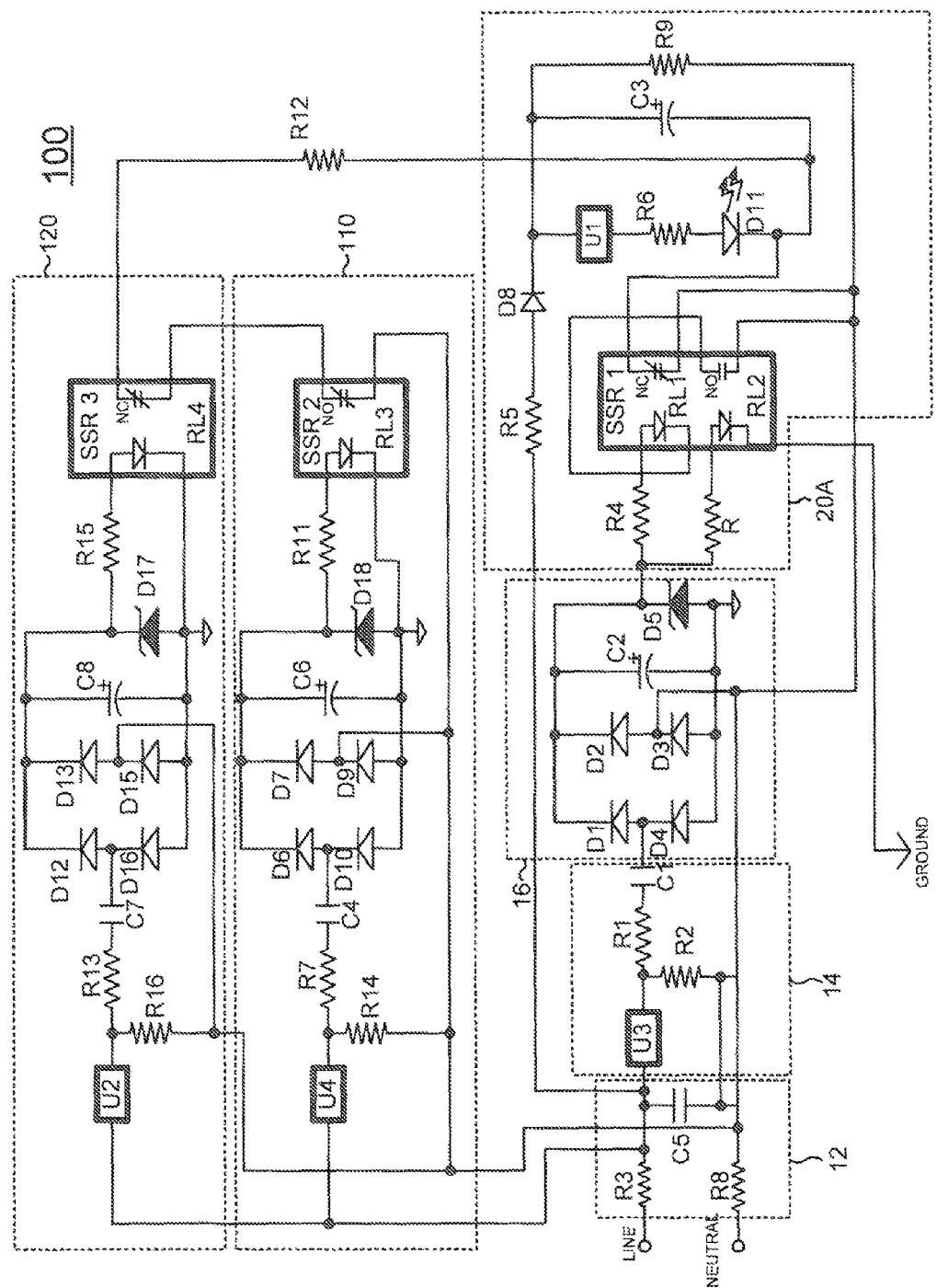
FIG. 5 is a circuit diagram of a voltage monitoring circuit according to further embodiments.

A voltage monitoring circuit 100 according to further embodiments is illustrated in FIG. 5. The voltage monitoring circuit 100 has a similar topology as the voltage monitoring circuit 50 shown in FIG. 4, with the addition of a second voltage monitoring stage, making the voltage monitoring circuit 100 a dual voltage monitoring circuit.

The first stage of the voltage monitoring circuit 100 includes an input filter 12, a line monitoring circuit 14, a rectifier 16, and an indicator 20A. The operation of these elements is similar to that described above in connection with FIGS. 3 and 4. The first stage of the voltage monitoring circuit 100 monitors LINE and GROUND voltages as described above.

The voltage monitoring circuit 100 additionally includes a second stage including lower and upper limit monitoring circuits 110 and 120. The lower limit monitoring circuit 110 includes a monitoring stage including a DIAC U4, resistors R7 and R14, and a capacitor C4. The DIAC U4 may be a K2000E70 bidirectional thyristor having a breakover voltage of about 190-215 volts and a holding current of about 60-150 milliamps. The resistors R7 and R14 may have resistances of about 120 ohms and 12 kohms, respectively, and the capacitor C4 may have a capacitance of about 0.22 microfarads. However, these circuit element values can be adjusted as desired for monitoring a different voltage level.

The lower limit monitoring circuit 110 further includes a rectifier including diodes D6, D7, D9, D10 and D18, capacitor C6, resistor R11 and a solid state relay SSR2 including a normally open relay RL3. The capacitor C6 may have a capacitance of about 470 microfarads. The resistor R11 may have a resistance of about 250 ohms. However, these circuit element values can be adjusted as desired for monitoring a different voltage level.

The upper limit monitoring circuit 120 includes a monitoring stage including a DIAC U2, resistors R13 and R16, and a capacitor C7. The DIAC U2 may be a K2200E70 bidirectional thyristor having a breakover voltage of about 205-230 volts and a holding current of about 60-150 milliamps. The resistors R13 and R16 may have resistances of about 120 ohms and 12 kohms, respectively, and the capacitor C7 may have a capacitance of about 0.22 microfarads. However, these circuit element values can be adjusted as desired for monitoring a different voltage level.

The upper limit monitoring circuit further includes a rectifier including diodes D17, D12, D13, D15 and D16, capacitor C8, resistor R15 and a solid state relay SSR3 including a normally closed relay RL4. The capacitor C8 may have a capacitance of about 470 microfarads. The resistor R15 may have a resistance of about 250 ohms. However, these circuit element values can be adjusted as desired for monitoring a different voltage level.

A first terminal of the DIAC U2 is coupled to the LINE voltage. A first terminal of the DIAC U4 is also coupled to the LINE voltage. A terminal of the normally closed contact of relay RL4 is coupled to the cathode of the LED D11 through a resistor R12. The other terminal of the normally closed contact of relay RL4 is coupled to a terminal of the normally open relay contact in the relay RL3. The other terminal of the normally open relay switch in the relay RL3 is connected to NEUTRAL.

As the LINE voltage continues to rise, it may reach a threshold (V2) determined by the breakover voltage of DIAC U4 and the resistance of resistor R14. At that point, the monitoring stage will pass the voltage to the rectifier in the lower limit monitoring circuit 110, causing the diode in the solid state relay RL3 to be energized. This will cause the normally open relay switch in the relay RL3 to close, which causes the LED D11 to blink. The resistor R12 is provided due to the higher voltage seen by the blinking circuit. The LED D11 will stop the on-off cycle when the LINE voltage reaches the level set by the combination of the DIAC U2 and the resistor R16. At that point, the normally closed relay switch in the solid state relay RL4 will open, disconnecting the cathode of the LED D11 from NEUTRAL.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A voltage monitoring circuit, comprising:
    a line monitoring circuit configured to receive an AC line voltage signal and generate an output voltage signal in response to an amplitude of the AC line voltage signal exceeding a threshold voltage;
    a rectifier circuit coupled to the line monitor circuit, and configured to receive the output voltage from the line monitoring circuit and generate a rectified voltage signal in response to the output voltage signal; and
    an indicator circuit coupled to the rectifier circuit and configured to receive the rectified voltage signal, wherein the indicator circuit is configured to generate an indicator signal in response to the rectified voltage signal wherein the indicator signal is indicative of the amplitude of the AC line voltage signal falling below the threshold voltage.

2. The voltage monitoring circuit of claim 1, wherein the line monitoring circuit comprises a DIAC that receives the AC line voltage signal.

3. The voltage monitoring circuit of claim 2, wherein the tine monitoring circuit further comprises a first resistor coupled between the DIAC and a neutral line, a second resistor coupled to the DIAC, and a transfer capacitor coupled to the second resistor.

4. The voltage monitoring circuit of claim 2, wherein the rectifier circuit comprises a full wave bridge rectifier having an input coupled to the transfer capacitor and an output coupled to an output capacitor and a Zener diode.

5. The voltage monitoring circuit of claim 4, wherein the indicator circuit comprises a light emitting diode and a solid state relay including an input diode coupled to the Zener diode and an output relay coupled the light emitting diode.

6. The voltage monitoring circuit of claim 5, wherein the indicator circuit further comprises a second MAC coupled to the line voltage and to the light emitting diode.

7. The voltage monitoring circuit of claim 6, further comprising a capacitor coupled in parallel with the second DIAC and the light emitting diode.

8. The voltage monitoring circuit of claim 4, wherein the indicator circuit comprises a light emitting diode and (a) a first solid state relay including a first input diode coupled to the Zener diode and a first output relay coupled the light emitting diode, and (b) a second solid state relay including a second input diode coupled to the Zener diode and to a ground line, and a second output relay coupled to the first input diode and to the light emitting diode.

9. The voltage monitoring circuit of claim 5, further comprising:
a lower limit monitoring circuit coupled to the AC line voltage signal and to the indicator circuit, wherein the lower limit monitoring circuit is configured to cause the indicator circuit to generate the indicator signal when an amplitude of the AC line voltage signal exceeds a voltage threshold.

10. The voltage monitoring circuit of claim 9, wherein the lower limit monitoring circuit comprises a DIAC coupled to the AC line voltage signal.

11. The voltage monitoring circuit of claim 9, wherein the voltage threshold comprises a first voltage threshold, the circuit further comprising:
an upper limit monitoring circuit coupled to the AC line voltage signal and to the indicator circuit, wherein the upper limit monitoring circuit is configured to cause the indicator circuit to turn off the indicator signal when the amplitude of the AC line voltage signal exceeds a second voltage threshold.

12. The voltage monitoring circuit of claim 11, wherein the upper limit monitoring circuit comprises a DIAC coupled to the AC line voltage signal.

13. The voltage monitoring circuit of claim 1, further comprising:
an indicator circuit coupled to the rectifier circuit and configured to receive the rectified voltage signal, wherein the indicator circuit is configured to generate an indicator signal in response to the rectified voltage signal.

14. The voltage monitoring circuit of claim 13, wherein the indicator circuit is configured to generate the indicator signal in response to an absence of the rectified voltage.

15. A voltage monitoring circuit, comprising:
a line monitoring circuit configured to receive an AC line voltage signal and generate an output voltage signal in response to an amplitude of the AC line voltage signal exceeding a threshold voltage;
a rectifier circuit coupled to the line monitor circuit and configured to receive the output voltage from the line monitoring circuit and generate a rectified voltage signal in response to the output voltage signal;
an indicator circuit coupled to the rectifier circuit and configured to receive the rectified voltage signal wherein the indicator circuit is configured to generate an indicator signal in response to the rectified voltage signal; and
a neutral monitoring circuit coupled to the indicator circuit and to a neutral line and a ground line and configured to monitor a voltage level of the neutral line relative to the ground line.

16. The voltage monitoring circuit of claim 15, wherein the neutral monitoring circuit comprises a diode having an anode coupled to the neutral line, a resistor coupled to the cathode of the diode, and a capacitor coupled to the resistor and the ground line, and wherein the indicator circuit comprises a relay having an input diode coupled to the capacitor and an output switch coupled to a light emitting diode.

17. A voltage monitoring circuit, comprising:
a line monitoring circuit including a DIAC coupled to an AC voltage supply line and configured generate an output voltage signal in response to an amplitude of an AC line voltage signal on the AC voltage supply line exceeding a predetermined threshold voltage;
a rectifier circuit coupled to the line monitor circuit and configured to receive the output voltage signal from the line monitoring circuit generate a rectified voltage signal in response to the output voltage signal;
an indicator circuit including a solid state relay coupled to the rectifier circuit and configured to receive the rectified voltage signal, wherein the indicator circuit is configured to generate an indicator signal in response to the rectified voltage signal being applied to an input of the solid state relay; and
a neutral monitoring circuit coupled the indicator circuit, wherein the neutral monitoring circuit and the indicator circuit are configured to generate a second indicator signal in response to a voltage on a neutral line being greater than a ground voltage.

18. The voltage monitoring circuit of claim 17, further comprising a lower limit monitoring circuit and an upper limit monitoring circuit coupled to the AC voltage supply line and to the indicator circuit, wherein the lower limit monitoring circuit is configured to cause the indicator circuit to generate the indicator signal when the amplitude of the AC line voltage signal exceeds a first voltage threshold, and wherein the upper limit monitoring circuit is configured to cause the indicator circuit to turn off the indicator signal when the amplitude of the AC line voltage signal exceeds a second voltage threshold.

19. A voltage monitoring circuit, comprising:
a line monitoring circuit configured to receive an AC line voltage signal and generate an output voltage signal in response to an amplitude of the AC line voltage signal exceeding a threshold voltage; and
a rectifier circuit coupled to the line monitor circuit and configured to receive the output voltage signal from the line monitoring circuit and generate a rectified voltage signal in response to the output voltage signal;
an indicator circuit coupled to the rectifier circuit and configured to receive the rectified voltage signal, wherein the indicator circuit is configured to generate an indicator signal in response to the rectified voltage signal; and
a lower limit monitoring circuit and an upper limit monitoring circuit coupled to the indicator circuit, wherein the lower limit monitoring circuit is configured to cause the indicator circuit to generate a first indicator signal when the amplitude of the AC line voltage signal exceeds a first voltage threshold, and wherein the upper limit monitoring circuit is configured to cause the indicator circuit to generate a second indicator signal when the amplitude of the AC line voltage signal exceeds a second voltage threshold.

* * * * *

UNITED STATES PATENT AND TRADEMARK OFFICE
CERTIFICATE OF CORRECTION

PATENT NO.         : 9,435,834 B2                          Page 1 of 1
APPLICATION NO.    : 14/196495
DATED              : September 6, 2016
INVENTOR(S)        : Deschenes et al.

It is certified that error appears in the above-identified patent and that said Letters Patent is hereby corrected as shown below:

In the Claims

Column 8, Claim 1, Line 49: Please correct "circuit, and" to read -- circuit and --

Column 8, Claim 3, Line 64: Please correct "tine" to read -- line --

Column 9, Claim 6, Line 10: Please correct "MAC" to read -- DIAC --

Signed and Sealed this
Sixth Day of June, 2017

Michelle K. Lee
*Director of the United States Patent and Trademark Office*